United States Patent
Yang et al.

(10) Patent No.: US 11,502,682 B2
(45) Date of Patent: Nov. 15, 2022

(54) RADIO FREQUENCY SWITCH CIRCUIT, COMMUNICATION UNIT AND METHOD THEREFOR

(71) Applicant: NXP B.V., Eindhoven (NL)

(72) Inventors: Xin Yang, Houten (NL); Mark Pieter van der Heijden, Eindhoven (NL); Jozef Reinerus Maria Bergervoet, Eindhoven (NL); Jasper Pijl, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/350,300

(22) Filed: Jun. 17, 2021

(65) Prior Publication Data
US 2022/0014186 A1    Jan. 13, 2022

(30) Foreign Application Priority Data
Jul. 9, 2020   (EP) .................................... 20185018

(51) Int. Cl.
*H03K 5/08*    (2006.01)
*H03K 17/56*   (2006.01)
(Continued)

(52) U.S. Cl.
CPC .............. *H03K 17/56* (2013.01); *G05F 1/56* (2013.01); *H03F 3/45475* (2013.01)

(58) Field of Classification Search
CPC ................ H03K 5/08; H03K 17/0822; H03K 19/00315; H03G 11/002; H03G 11/02
(Continued)

(56) References Cited

U.S. PATENT DOCUMENTS 6,884,950 B1 *   4/2005   Nicholson .......... H01H 59/0009
                                              200/181
7,564,663 B2 *   7/2009   Nicholson .............. H02H 9/046
                                              327/309
(Continued)

FOREIGN PATENT DOCUMENTS

EP         1124336 A1      8/2001
KR       20040003609 A      1/2004

OTHER PUBLICATIONS

Gong, Y., "A Compact, High-Power, 60 GHz SPDT Switch Using Shunt-Series SiGe PIN Diodes", 2019 IEEE Radio Frequency Integrated Circuits Symposium (RFIC), Jun. 2-4, 2019.
(Continued)

*Primary Examiner* — Quan Tra

(57) ABSTRACT

A radio frequency, RF, switch circuit (201, 301, 401, 501, 601, 701, 751, 801) includes at least one first PiN diode device (252, 352, 452, 552, 652, 752, 852, 945) configured to sink or source a first alternating current; and an impedance inversion circuit (222, 322, 422, 522, 622, 722, 822, 922), connected to the at least one first PiN diode device and arranged to provide a transformed impedance between a first side of the impedance inversion circuit and a second side of the impedance inversion circuit. The RF switch further includes a second diode-based device (254, 354, 454, 554, 654, 754, 854, 945) configured to source or sink a second alternating current; and a bias circuit (330, 430, 530, 630, 830, 930) connected to at least one of the at least one first PiN diode device and the second diode-based device, wherein the at least one first PiN diode device cooperates with the second diode-based device as a push-pull current circuit.

18 Claims, 9 Drawing Sheets

(51) Int. Cl.
  *G05F 1/56* (2006.01)
  *H03F 3/45* (2006.01)
(58) Field of Classification Search
  USPC .......................... 333/101–104; 327/309–313
  See application file for complete search history.

(56) References Cited

U.S. PATENT DOCUMENTS

| | | | | |
|---|---|---|---|---|
| 2002/0180552 A1* | 12/2002 | Bennett | ................. | H03G 11/02 |
| | | | | 333/17.2 |
| 2010/0277839 A1* | 11/2010 | Nicholson | ................ | G01R 1/36 |
| | | | | 361/54 |
| 2011/0102063 A1* | 5/2011 | Zeller | ................. | H03G 1/0052 |
| | | | | 327/520 |
| 2015/0091776 A1 | 4/2015 | Gaynor et al. | | |

OTHER PUBLICATIONS

Song, P., "A High-Power, Low-Loss W-band SPDT Switch Using SiGe PIN Diodes", 2014 IEEE Radio Frequency Integrated Circuits Symposium, Jun. 1-3, 2014.

* cited by examiner

FIG. 1 –
Prior Art

RADIO FREQUENCY SWITCH CIRCUIT, COMMUNICATION UNIT AND METHOD THEREFOR

CROSS-REFERENCE TO RELATED APPLICATIONS

This application claims the priority under 35 U.S.C. § 119 of European Patent application no. 20185018.7, filed on 9 Jul. 2020, the contents of which are incorporated by reference herein.

FIELD OF THE INVENTION

The field of the invention relates to a radio frequency (RF) switch circuit, a communication unit having a radio frequency switch circuit and a method therefor. The invention is applicable to, but not limited to, a low power, high-linearity quarter wavelength PiN diode-based RF switch circuit.

BACKGROUND OF THE INVENTION

In many communications and high frequency applications, it is necessary to switch the radio frequency (RF) signal path in order to re-route and connect RF signals to, say, different antennas, amplifiers, and filters. This need for more switching with higher performance is only growing with the development of multiple-in multiple-out (MIMO), multi-band wireless fifth generation (5G) devices, and other advanced technologies, especially for portable and battery-powered devices. Switching RF power in portable applications is challenging for electromechanical switches due to competing considerations such as size, cost and speed.

In the field of RF and microwave engineering, there are many forms of radio frequency (RF) switches, with a PIN diode RF switch being particularly popular. A PiN diode is a diode with a wide, undoped intrinsic semiconductor region between a p-type semiconductor region and an n-type semiconductor region. A PiN diode typically behaves as a current-controlled non-linear resistor and capacitor/varactor at radio and microwave frequencies. Like the conventional PiN diode, it allows current flow in one direction when forward biased, but not in the other when it is reverse biased. The PiN diode has an excellent small signal performance as a shunt switch device in $\lambda/4$ switch topology, and since the undoped intrinsic semiconductor region in PiN diodes decrease the off-state capacitance when reverse-biased, the PiN diode is often the preferred RF switch to use due to its much better insertion loss and higher isolation performance. However, whilst PiN diodes offer some unique advantages relative to other non-mechanical options, such as complementary metal oxide semiconductor (CMOS) switches and micro-electro-mechanical system (MEMS) structures, they are difficult to design into a circuit unless their characteristics are clearly understood.

RF PiN diode switches are often realised on a printed circuit board or a monolithic microwave integrated circuit that utilises quarter wavelength ($\lambda/4$) transmission lines (TLs), as illustrated in FIG. 1. FIG. 1 illustrates a diagram 100 of a known RF front-end (FE) circuit that includes a receive side 110 and an antenna/transmit side 150, connected by a $\lambda/4$ TL 152. In a conventional ($\lambda/4$) switch with a PiN diode device, only a unidirectional PiN diode 132 is applied to function as a shunt switch. A first dc bias 160 is applied via a first resistor 162 to a first port 130 connected to the positive junction of the PiN diode 132 and a second dc bias 170 is applied via a second resistor 172 to a second port 140 connected to the negative junction of the PiN diode 132, with an ac decoupling capacitor 142 connected to ground 102. In operation in a transmit mode, first dc bias 160 is arranged to be higher than the second dc bias 170 and then the PiN diode 132 is turned 'on'. Node 120 is shorted to ac ground by the shunt switch PiN diode 132 and the $\lambda/4$ transmission line transforms from a low impedance at Node 120 to a high impedance at Node B 150. There is a small voltage swing but a very large current swing at the Node 120, so the shunt switch PiN diode 132 needs to handle a large amount of RF current swing. Since the PiN diode 132 only allows current to flow from P-junction to N-junction, this single direction PiN diode configuration can only 'sink' current, but is unable to 'source' a large ac current swing, which means the shunt PiN diode 132 has to be biased in a Class-A mode in order to maintain a high linearity performance.

In order to increase the circuit linearity (1 dB compression point (OP1 dB)), the bias current has to be increased. However, the conventional topology has a significant trade-off between linearity and dc power dissipation in a transmit mode of operation, i.e. where there is a large signal current. Also, in applications such as 5G base stations, communication is based on orthogonal frequency division multiplex (OFDM) modulation with peak-to-average power ratio (PAPR)=10 dB. Hence, the RF system is working with a 10-dB back-off average power. Thus, operating the PiN diode with a Class-A bias and high dc bias current in order to accommodate the peak-power signals causes the system to operate at low efficiency and is thus not acceptable in a large number of practical implementations.

The paper titled "Peter Song etc. "A High-Power, Low-Loss W-band SPDT Switch Using SiGe PIN Diodes", in *IEEE Radio Frequency Integrated Circuits Symposium* 2014, pp. 195-198 describes a quarter wavelength switch that uses an unidirectional PiN diode as the shunt switch. As clarified earlier, this PiN diode configuration can only sink but cannot source ac current swing, which causes a fundamental trade-off between linearity and dc power dissipation.

SUMMARY OF THE INVENTION

The present invention provides a RF switch circuit with a PiN diode switch, a communication unit, and a method therefor, as described in the accompanying claims. Specific embodiments of the invention are set forth in the dependent claims. These and other aspects of the invention will be apparent from, and elucidated with reference to, the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Figure 1:
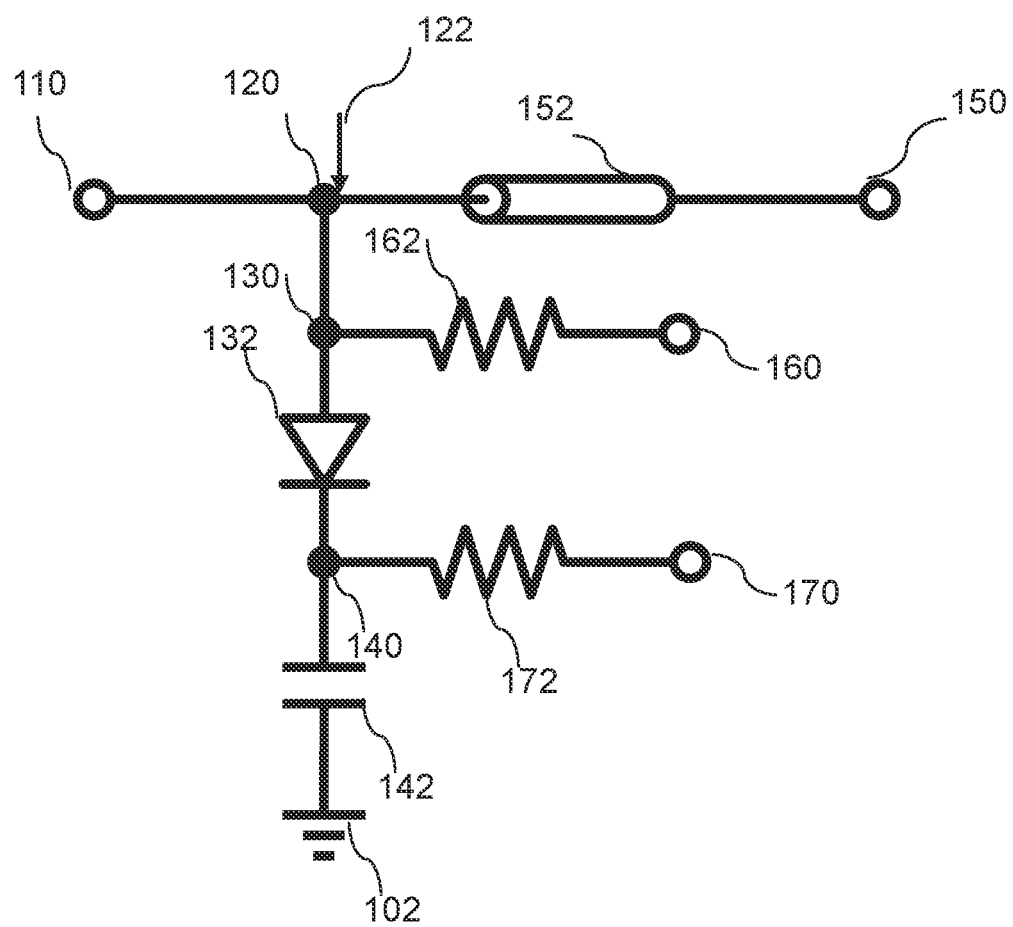
FIG. 1 illustrates a simplified known drawing of a RF front-end (FE) circuit that includes a typical $\lambda/4$ PiN diode switch circuit.

Examples of the present invention address the existing problem that a PiN diode configuration can only sink, but cannot source a large ac current swing, thereby causing a fundamental trade-off between linearity (in having to use a Class-A bias arrangement) and dc power dissipation (due to a high dc bias current), by proposing a push-pull diode-based configuration.

In a first aspect of the invention, examples of the present invention provide a radio frequency (RF) switch circuit that includes at least one first PiN diode device configured to sink or source a first alternating current; and an impedance inversion circuit, connected to the at least one first PiN diode device and arranged to provide a transformed impedance between a first side of the impedance inversion circuit and a second side of the impedance inversion circuit. The RF switch further includes a second diode-based device configured to source or sink a second alternating current; and a bias circuit connected to at least one of the at least one first PiN diode device and the second diode-based device, wherein the at least one first PiN diode device together with the second diode-based device cooperate as a push-pull current circuit. In this manner, by using a diode-based configuration, for example, as a shunt switch, in order to both sink and source large current swings, there is no need to bias the at least one first PiN diode in a Class A mode, but can bias it in, say, a Class-AB mode thereby saving a significant amount of dc current dissipation, e.g. 100 mA down to say 5 mA. In some examples, a use of a push-pull diode-based configuration may save a significant amount of dc current dissipation, whilst still achieving high linearity.

In some examples, a RF switch circuit and, a communication unit having a RF switch circuit with a push-pull diode-based configuration, an output voltage regulated bias circuit may be employed that avoids voltage dipping due to a self-biased (current rectification) effect of the push-pull diode-based configuration in order to maximize a linearity of the RF switch. In some examples of the RF switch, the push-pull diode-based configuration includes a push-pull PiN diode configuration. In some examples of the RF switch, various voltage regulator bias circuits are described. For example, in some example embodiments, the bias resistor of the known RF switches that employ a PiN diode, is removed and replaced by a voltage regulator, which may significantly improve the linearity of push-pun PiN diodes. More generally speaking, a typical bias circuit for a linearized Class-AB HBT power amplifier may be used as the bias circuit for a shunt push-pull diode-based configuration (e.g. using PiN diodes) in some examples.

In some examples, the second diode-based device may be a second PiN diode. In some examples, the at least one first PiN diode device and the second diode-based device may be forward biased, i.e. turned 'ON', when the RF switch is configured to operate in a first transmit mode of operation and wherein the at least one first PiN diode device and the second diode-based device may be reverse biased and turned 'OFF' in a second receive mode of operation. In some examples, the RF switch circuit may include a shunt switch in the first transmit mode of operation and may include a series switch in the second receive mode of operation.

In some examples, the impedance inversion circuit may be located between a receive port and a transmit port, and the impedance inversion circuit and may include one of: (i) a quarter-wave transmission line, (ii) a circuit comprised of a first lumped ac decoupling capacitor, C, with a series inductor, L, with a second ac decoupling C.

In a second aspect, examples of the present invention provide a communication unit that includes the RF switch according to the first aspect. In a third aspect, examples of the present invention provide a method of RF switching using a push-pull arrangement of a combination of at least one first PiN diode device and a second diode-based device. The method includes connecting at least one first PiN diode device to a second diode-based device to operate as a push-pull current circuit, connecting an impedance inversion circuit to the at least one first PiN diode device that provides a transformed impedance between a first side of the impedance inversion circuit and a second side of the impedance inversion circuit, and applying a bias current to at least one or the at least one first PiN diode device and the second diode-based device, wherein the applied bias current configures the at least one first PiN diode device and the second diode-based device to sink an alternating current or source an alternating current.

Figure 2:
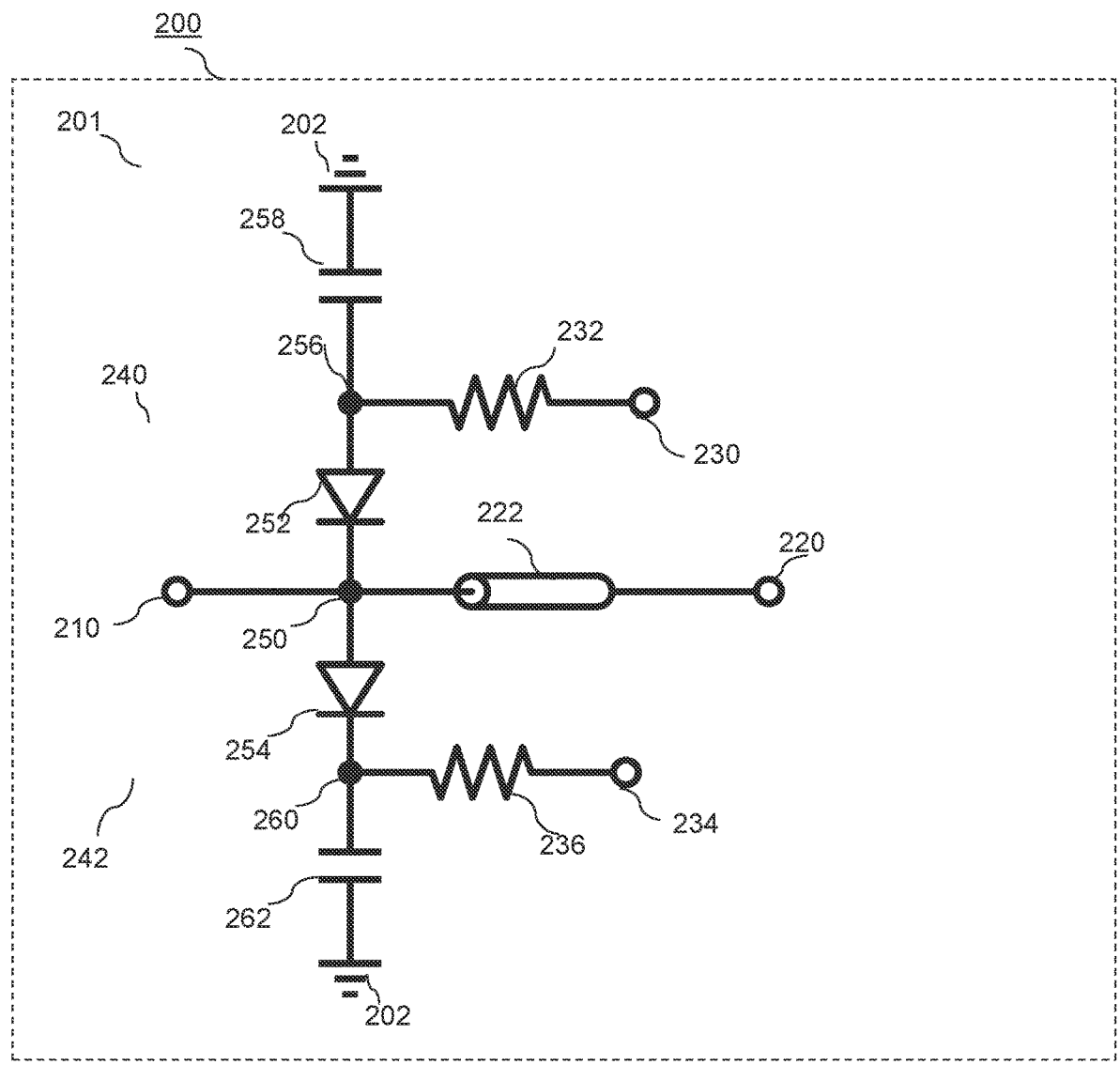
FIG. 2 illustrates a communication unit with a $\lambda/4$ switch with push-pull diode-based configuration, according to example embodiments of the invention.

Referring first to FIG. 2, a communication unit 200 with an RF switch circuit 201 with a push-pull diode-based 252, 254 configuration is illustrated. An output voltage regulated bias circuit may be employed that avoids voltage clipping, for example as a result of a self-biased (current rectification) effect of the push-pull diode-based configuration, in order to maximize a linearity of the RF switch circuit 201, according to example embodiments of the invention. In this example, the communication unit 200 comprises a RF front-end (FE) circuit that includes a receiver port 210 and a transmitter and an antenna port 220, each comprising distinct circuits and signal paths, and each coupled to an antenna or array or antennas (not shown). In this example, the transmitter and antenna port 220 is coupled to a push-pull PiN diode 252, 254 circuit via a λ/4 transmission line (TL) 222, according to example embodiments of the invention. Thus, compared to a single shunt PiN diode topology in FIG. 1, an additional PiN diode 252 is added to the RF switch circuit 201 to form a push-pull diode-based circuit. Advantageously, this push-pull diode-based circuit allows both current sourcing 240 and current sinking 242.

Alternatively, in some examples of the invention, the λ/4 TL 222 may be implemented using a first lumped element ac decoupling capacitor C—a series inductor L—a second ac decoupling capacitor C network, which typically provides better RF performance. The fundamental operation principle is still based on λ/4 TL 222 wave transmission theory (with, say, a 50 Ohm→50 Ohm impedance match configuration (or any suitable characteristic impedance towards the antenna) used in a receive mode of operation for the RF switch and a short circuit→open circuit used in a transmit mode of operation). Thus, in the examples herein described, it is envisaged that the λ/4 TL or lumped element circuit alternatives may be used interchangeably.

In the illustrated RF switch circuit 201 (with a λ/4 TL) a first dc bias 230 is applied via a first resistor 232 to a first port 258. The first port 256 is connected to ground 202, via a first ac decoupling capacitor 258. The first port 256 is also connected to a positive junction of a first diode-based device, such as first PiN diode 252, whereby the negative junction of the first diode-based device is connected to a second node 250, also coupling the receiver port 210 to the λ/4 transmission line (TL) 222. The second node 250 is also coupled to a positive junction of a second diode-based device, such as second PiN diode 254. A second dc bias 234 is applied via a second resistor 236 to a third port 260 connected to the negative junction of the second diode-based device, such as second PiN diode 254. The third port 260 is also connected to ground 202, via a second ac decoupling capacitor 262.

In an "ON" mode, first port 256 is high (for example 1.5V) and third port 260 is low (for example 0V); thus a (small) DC current is now flowing through the diodes since they are forward biased. Any positive RF current coming from antenna port 220 is sinked through second PiN diode 254, and any negative RF current from antenna port 220 is sourced through first PiN diode 252. In an "OFF" mode, first port 256 is low and third port 260 is high. There is no DC current due to the nature of the diode blocking reverse current. Second PiN diode 254 and first PiN diode 252 are unable to sink/source any current, and thus the switch is "off" (in this case, since this example includes a shunt switch that allows RF signals to flow from antenna port 220 into whatever receiver circuit lies beyond receiver port 210).

Thus, in example operation (say in a transmit mode of operation), both PiN diodes are turned 'ON'. The two diode-based components/circuits, such as the first PiN diode 252 and second PiN diode 254 in this example may be biased in a Class-AB mode, with a very low dc bias current dissipation whilst still achieving a good linearity. A skilled artisan will recognise that this may be achieved in the example circuit due to a self-bias (diode rectification) effect, as described subsequently with respect to FIG. 11. Here, the dc component of the PiN diode bias current increases with the transmit output power increasing (i.e. Node current swing increases). In this manner, Rbias 232, 236 will cause the voltage clipping and thereby limit the linearity. Hence, the in some examples, Rbias 232, 236 can be removed and replaced by a voltage regulator bias circuit to further improve linearity.

However, when Rbias is removed, the dc bias current is exponential to the voltage difference between dc bias1 230 and dc bias2 234. Therefore, it is critical to accurately control the bias voltage whilst keeping output impedance low. In some examples, the accurate control of the bias voltage, whilst keeping output impedance low, may be achieved, for example, by using a current mirror plus a voltage regulator.

Figure 3:
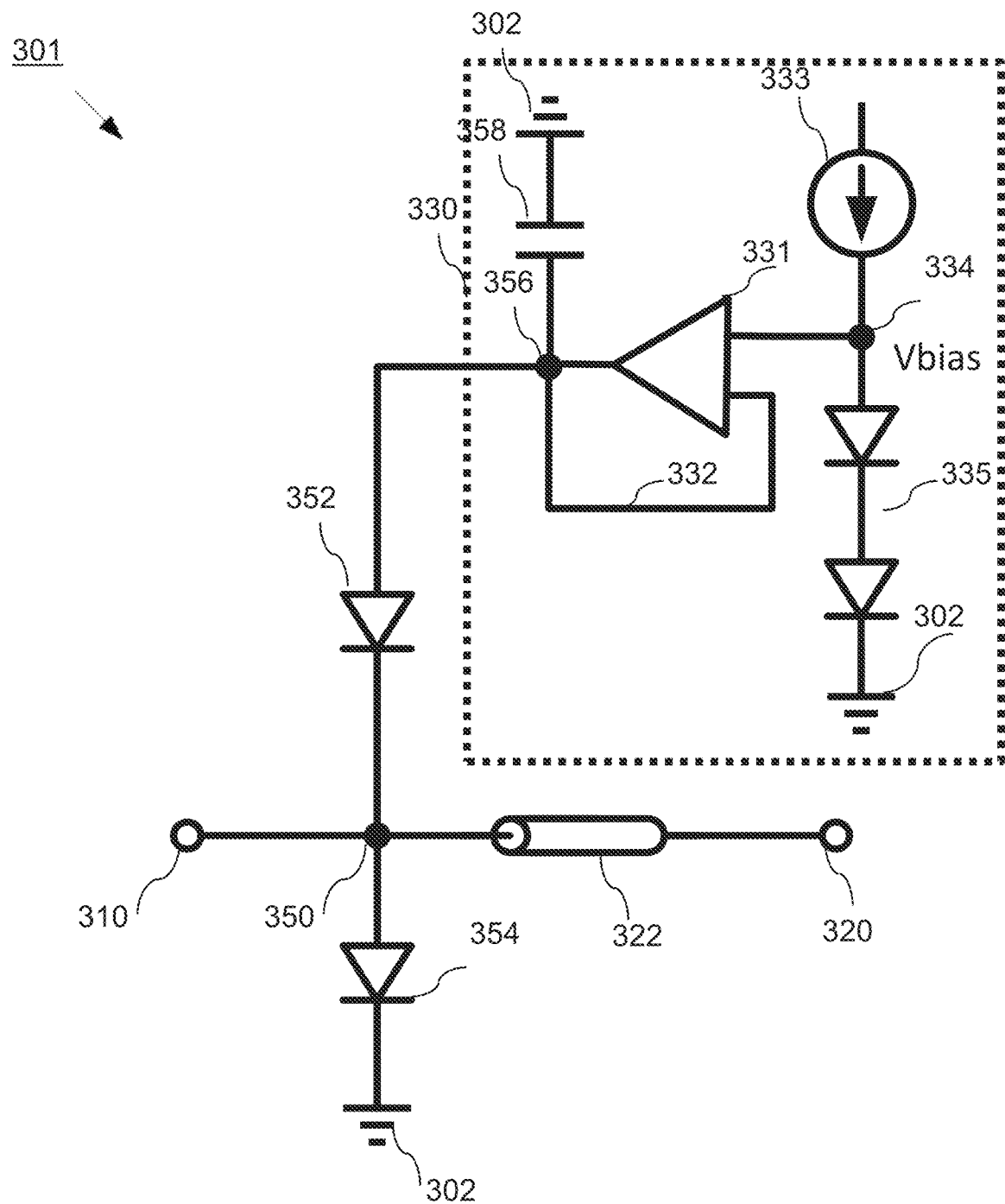
FIG. 3 illustrates one example of a λ/4 switch with push-pull diode-based configuration and a linearization bias circuit, according to some example embodiments of the invention.

Referring now to FIG. 3, FIG. 3 illustrates one simplified circuit example of a λ/4 RF switch circuit 301 with push-pull diode-based components/circuits, such as the first PiN diode 352 and second PiN diodes 354, and linearization bias circuit 330, according to some example embodiments of the invention. Again, this example includes a receiver port 310 and a transmitter and an antenna port 320, each comprising distinct circuits and signal paths, and each coupled to antenna or array of antennas (not shown). In this example, the transmitter and antenna port 320 is coupled to a push-pull PiN diode 352, 354 circuit via a λ/4 transmission line (TL) 322, according to example embodiments of the invention. Thus, compared to a single shunt PiN diode topology in FIG. 1, an additional PiN diode 352 is added to the RF switch 301 to form a push-pun diode-based circuit. Advantageously, this push-pull diode-based circuit allows both current sourcing and current sinking.

In the illustrated RF switch circuit 301 (with a λ/4 TL) a voltage regulated linearization bias circuit 330 is configured to apply a bias voltage at a first port 356. The first port 356 is connected to ground 302, via a first shunt ac decoupling 358. The first port 356 is also connected to a positive junction of a first diode-based device, such as first PiN diode 352, whereby the negative junction of the first diode-based device is connected to a second node 350, also coupling the receiver port 310 to the λ/4 transmission line (TL) 322. The second node 350 is also coupled to a positive junction of a second diode-based device, such as second PiN diode 354.

In operation, the voltage regulated linearization bias circuit 330 includes a dc current source 333 coupled to two replica diodes 335 that provide the reference voltage (Vbias) 334 to accurately control the dc bias current of first PiN diode switch 352. In FIG. 3, a closed loop Operational-Amplifier 331 serves as a voltage buffer with feedback 332 in order to decrease the dc output impedance of linearization bias circuit 330. In this manner, the bias voltage at first port 356 will remain constant when the transmit output power increases, and the dc component of the PiN diode bias current increases.

Figures 4, 5, 6:
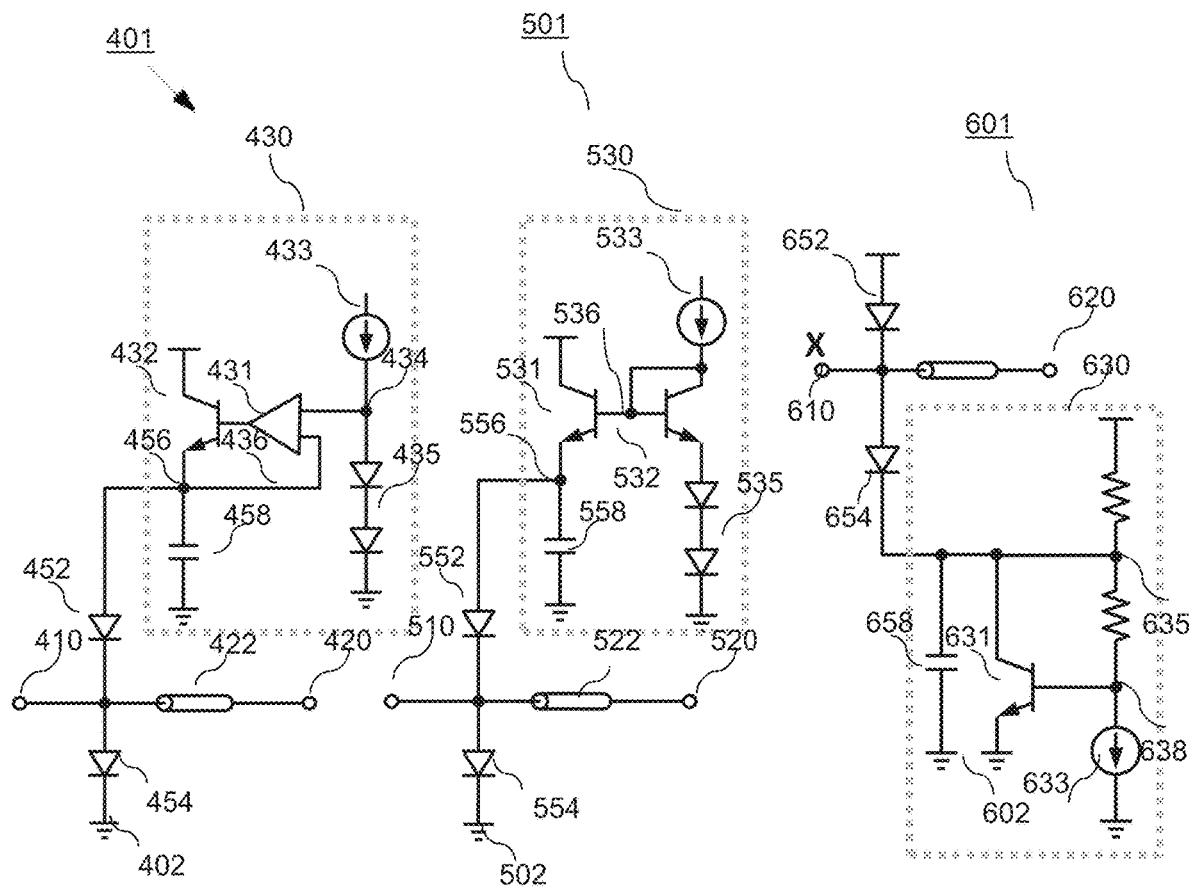
FIG. 4 illustrates a first alternative linearization bias circuit to control the λ/4 switch with a push-pull diode-based configuration, according to some example embodiments of the invention
FIG. 5 illustrates a second alternative linearization bias circuit for a λ/4 switch with push-pull diode-based configuration, according to some example embodiments of the invention
FIG. 6 illustrates a third alternative linearization bias circuit for a λ/4 switch with push-pull diode-based configuration, according to some example embodiments of the invention

Referring now to FIG. 4, FIG. 4 illustrates a first alternative linearization bias circuit 430 to control the λ/4 RF switch circuit 401 with diode-based components/circuits, such as first PiN diode 452 and second PiN diodes 454 push-pull PiN diodes, according to some example embodiments of the invention. The first alternative linearization bias circuit 430 is similar to the linearization bias circuit 330 of FIG. 3, so similar circuit components and circuits and similar operation thereof will not be repeated, for the sake of clarity.

In contrast to the linearization bias circuit 330 of FIG. 3, first alternative linearization bias circuit 430 adds an emitter follower 432 as a buffer amplifier for the Operational-Amplifier 431. By adding the emitter follower 432 as buffer amplifier, the OA 431 does not require a high current driving capability. Thereafter, the voltage at first node 434 is the reference voltage to bias the first PiN diode 452 (which determines the quiescent bias current). In this example, the OA 431 and emitter follower 432 as buffer amplifier form a closed loop to provide a stable voltage 456 at third node that is the same as the reference voltage at first node 434.

When the bias current of the PiN diode 452 increases, the output voltage of OA 431 increases. In this manner, the Vbe of emitter follower 432 as a buffer amplifier for the Operational-Amplifier 431 increases and ensures that the third node voltage 456 is constant, regardless of any change to bias current. Thus, in general, when the ac current amplitude of the diode-based components/circuits (e.g. PiN diodes) increases, the dc bias current also increases due to the self-bias effect as described in reference to FIG. 11. In this manner, the first alternative linearization bias circuit 430 operates to ensure that the third node voltage 456 is insensitive to current changes.

Referring now to FIG. 5, FIG. 5 illustrates a second alternative linearization bias circuit 530 to control the λ/4 RF switch circuit 501 with push-pull diode-based components/circuits, such as first PiN diode 552 and second PiN diodes 554, according to some example embodiments of the invention. The second alternative linearization bias circuit 530 is similar to the linearization bias circuit 330 of FIG. 3 and the first linearization bias circuit 430 of FIG. 4, so similar circuit components and circuits and the operation thereof will not be repeated, for the sake of clarity. In contrast to the first linearization bias circuit 430 of FIG. 4, the second alternative linearization bias circuit 530 removes the OA feedback loop 436 in FIG. 4 and provides a simple current mirror 532 plus voltage regulator bias circuit that is stable and easy to implement. One potential drawback of the second alternative linearization bias circuit 530 is that the output impedance of the current mirror 532 plus voltage regulator bias circuit is slightly lower without the OA feedback path. In this example, when the bias current of the push-pull diode-based components/circuits, such as the first PiN diode 552 and second PiN diodes 554, increases, the voltage at fourth node 536 is constant. In order to provide more bias current, the Vbe of the emitter follower 531 will slightly increase, which results in a slight voltage decrease at fifth node 556. The voltage variations depend upon the transconductance of the npn transistor in the emitter follower 531, where the higher transconductance results in a lower voltage variation, based on:

$$\Delta Vbe = \Delta I / gm \qquad [1]$$

In this manner, the second alternative linearization bias circuit 530 operates to ensure that the fifth node voltage 556 is insensitive to current changes.

Referring now to FIG. 6, FIG. 6 illustrates a third alternative linearization bias circuit 630 to control the λ/4 RF switch circuit 601 with push-pull diode-based components/circuits, such as first PiN diode 652 and second PiN diode 654, according to some example embodiments of the invention.

The third alternative linearization bias circuit 630 is similar to the linearization bias circuit 330 of FIG. 3 and the first linearization bias circuit 430 of FIG. 4, and the second linearization bias circuit 530 of FIG. 5, so similar circuit components and circuits and the operation thereof will not be repeated, for the sake of clarity. In this example, the third alternative linearization bias circuit 630 uses a transimpedance amplifier circuit 631 to bias the second PiN diode 654. When the bias current of second PiN diode 654 increases, the seventh node voltage 638 increases and the npn in the transimpedance amplifier circuit 631 will sink more current to keep the sixth node voltage 635 constant. Thus, in this manner, the third alternative linearization bias circuit 630 operates to ensure that the sixth node voltage 635 is insensitive to current changes.

Figure 7:
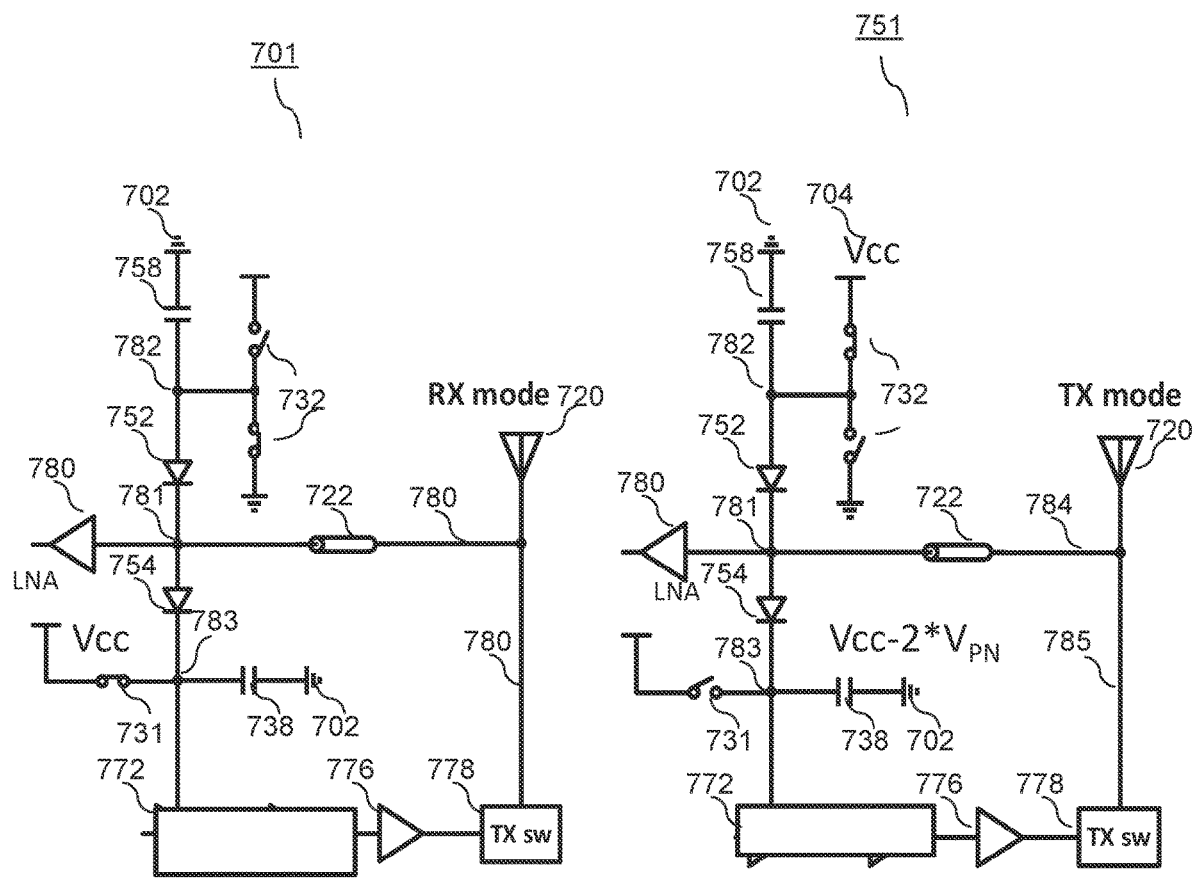
FIG. 7 illustrates a receive mode of operation and a transmit mode of operation of the third alternative bias circuit of FIG. 6, where the PiN diodes are reverse-biased and turned 'off' or turned 'on' and re-use the current flowing through the PA pre-driver, according to some example embodiments of the invention.

Referring now to FIG. 7, FIG. 7 illustrates a yet further alternative biasing strategy to control a λ/4 RF switch 701, 751, with push-pull diode-based components/circuits, such as the first PiN diode 752 and second PiN diodes 754, according to some example embodiments of the invention. The yet further alternative bias circuit is similar to the third alternative linearization bias circuit 630 of FIG. 6, so similar circuit components and circuits and the similar operation thereof will not be repeated, for the sake of clarity.

Again, this example includes a receiver chain that is shown as commencing with a low noise amplifier (LNA) 780 and a transmitter chain that includes a power amplifier (PA) pre-amplifier (pre-PA) transmitting circuitry 772, a power amplifier (PA) 776 and a transmit/antenna switch 778 and an antenna port 720. Each of the receiver chain and transmitter chain include further distinct circuits and signal paths, that are not shown.

In a transceiver example, the receive switch contains push-pull PiN diodes 752 and 754 and a λ/4 TL 722. In a transmit mode, transmit/antenna switch 778 is turned 'ON' and provides a signal path from PA 776 to node 785. The push-pull PiN diodes 752 and 754 are turned 'ON', and the RF voltage between the nodes 781, 782 and 783 is shorted. AC decoupling capacitors 758 and 738 are large enough to serve as a decoupling capacitor and create RF ground at nodes 782 and 783. Thus, node 781 is also a RF ground. The λ/4 line 722 serves as an impedance invertor, which transforms the RF ground at node 781 to a RF open-circuit at node 784. In this manner, the RF signal at node 785 will not leak to the receive path 784 and will transmit out through antenna port 720.

The opposite occurs in a receive mode of operation. For example, transmit/antenna switch 778 is turned 'OFF' and provides an RF open-circuit at node 785. The push-pull PiN diodes 752 and 754 are turned 'OFF'. Thus, the impedance at node 781 is the LNA 780 input impedance ($Z_0$, which is usually 50 Ohm). The λ/4 TL 722 transforms impedance $Z_0$ at 781 to impedance $Z_0$ at 784. In this manner, the RF signal from antenna port 720 will not leak into the transmit path at node 785 and will be received by the receive path 784. In this manner, isolation of λ/4 line 722 is determined by the PiN diode ON/OFF status.

In this example, the positive junction of the first diode-based device, such as first PiN diode 752 is connected to ground 702, via a first ac decoupling capacitor 758. The negative junction of the first diode-based device is connected to a second node 750, also coupling the receiver port 710 to the λ/4 transmission line (TL) 722. The second node 750 is also coupled to a positive junction of the second diode-based device, such as second PiN diode 754. In this example, the transmitter and an antenna port 320 is coupled to the push-pull PiN diode 752, 754 circuit via the λ/4 transmission line (TL) 722, according to example embodiments of the invention. In this example, and in an application for an RF switch that switches between connecting the receiver chain to the antenna or connecting the transmitter chain to the antenna, the transimpedance amplifier circuit 631 of FIG. 6 to bias the second PiN diode 654 is replaced by a circuit where the linearity is not-critical (e.g. a power amplifier (PA) pre-driver circuit or component) in, say, a Front-End IC. In some examples, the use of any bias circuit or bias current that is not linearity-critical may enable a re-use of the current flowing there through (e.g. a PA pre-driver circuit) thereby saving the total power consumption, according to some example embodiments of the invention.

Although this example describes a circuit configuration that reuses current sourced from a PA pre-driver circuit, it is envisaged that it is equally applicable to other transmitter circuits, e.g. in any lower power circuit, for example a variable-gain amplifier (VGA), a vector modulator, a proportional to absolute temperature (PTAT) sensor, etc.

In the first circuit 701, illustrating a receive mode of operation, the push-pull diode-based components/circuits (e.g. the PiN diodes in this example) are reverse-biased and turned 'OFF', as illustrated by the switches 732 connecting the positive junction of the first diode-based device to ground and switch 731 connecting the negative junction of the second diode-based device 754 to the supply voltage Vcc 704. In the second circuit 751, illustrating a transmit mode of operation, the push-pull diode-based components/circuits (e.g. the PiN diodes in this example) are not reverse-biased and turned 'ON', as illustrated by the switches 732 connecting the positive junction of the first diode-based device to the supply voltage Vcc 704 and switch 731 disconnecting the negative junction of the second diode-based device 754 to the supply voltage Vcc 704. In this manner, the PiN diodes 752, 754 are turned 'ON' and a voltage of Vcc–(2*Vpn) applied to the pre-PA transmitting circuitry. In this manner, the push-pull diode-based components/circuits re-uses the current flowing through, say, the PA pre-driver of the pre-PA transmitting circuitry 722.

A skilled artisan will recognize that the three switches 731, 732 are not RF-related switches and can be implemented using classical metal oxide semiconductor (MOS) devices. In some examples, the trade-off provided by the circuits of FIG. 7 is that the PA pre-driver operates with a lower Vcc (and therefore consequently provides a lower output power). However, since the PA pre-driver linearity is not critical in the vast majority of communications systems, applying this trade-off is a good solution.

Although this example is described with respect to an application for a transmitter/receiver, in coupling to an antenna, it is envisaged that the concept herein described works for any circuit that has at least two parts whereby one part operates while the other part is inactive, such as a modulator/demodulator or two parallel amplifiers (e.g. for two different bands).

Figure 8:
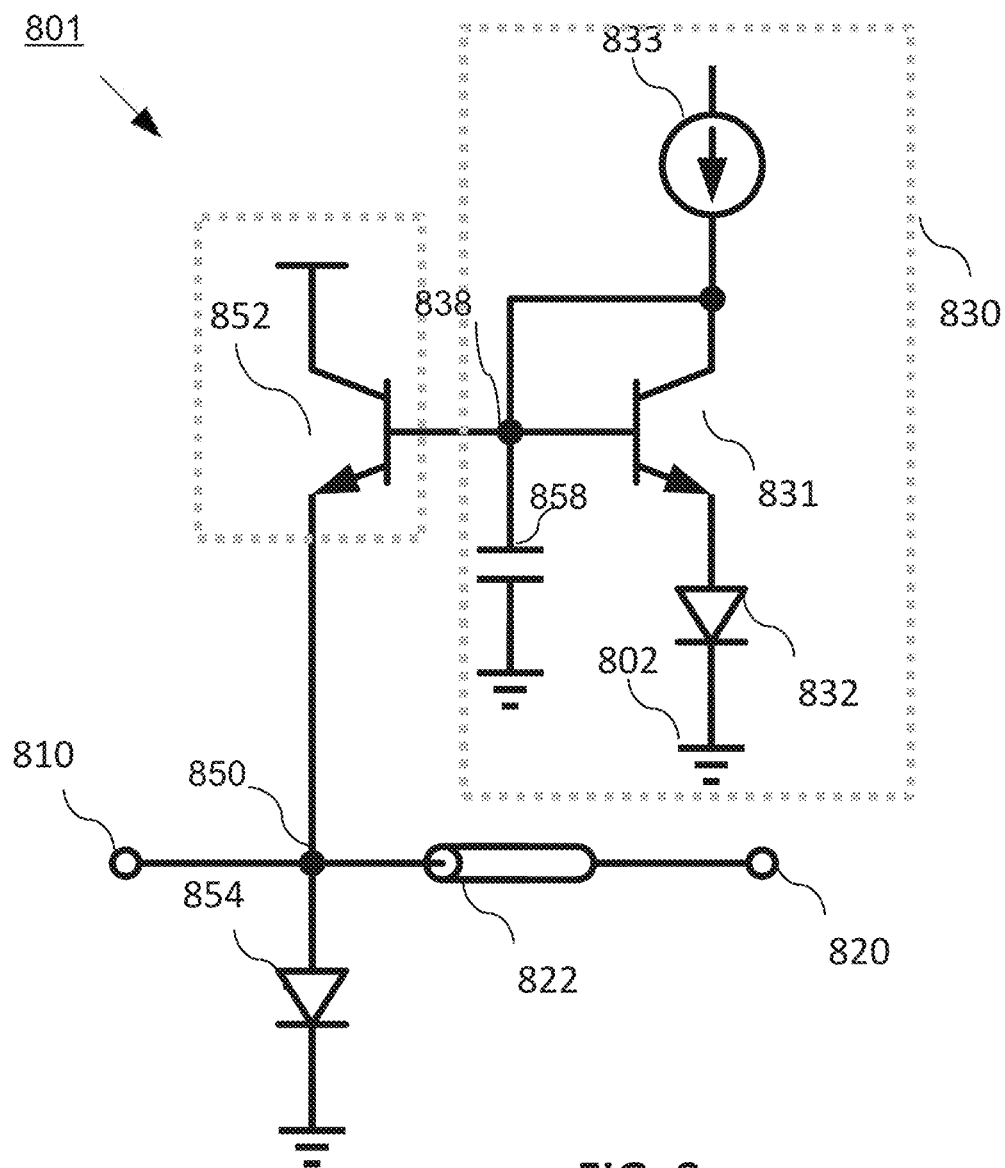
FIG. 8 illustrates an alternative topology that replaces, say, the top PiN diode of FIG. 2 with a npn transistor, according to some example embodiments of the invention

Referring now to FIG. 8, FIG. 8 illustrates a yet further alternative bias circuit topology to control a λ/4 RF switch circuit 801 with push-pull diode-based components/circuits, according to some example embodiments of the invention. The yet further alternative bias circuit is similar to the second alternative linearization bias circuit 530 of FIG. 5, so similar circuit components and circuits and similar operation thereof will not be repeated, for the sake of clarity In the yet further alternative bias circuit topology example, the top diode-based component of FIGS. 2-7 has been replaced with a npn transistor 852, according to some example embodiments of the invention. Again, this example includes a receiver port 810 and a transmitter and antenna port 820, each comprising distinct circuits and signal paths, and each coupled to an antenna or array of antennas (not shown). In this example, the transmitter and antenna port 820 is coupled to a push-pull diode-based circuit via a λ/4 transmission line (TL) 822, according to example embodiments of the invention. Thus, in this example, and compared to the PiN diode employed in the examples of FIGS. 2-7, a npn transistor 852 is used to replace the additional top PiN diode 352, 452, 552, 652, 752, which forms a yet further alternative push-pull diode-based circuit. Advantageously, this push-pull diode-based circuit allows both current sourcing and current sinking.

In the illustrated RF switch circuit 801 (with a λ/4 TL 822) a base-to-emitter junction of a npn transistor 852 serves as a P-N diode in order to source current swing at a switch to a transmit mode of operation. In this example, the top diode-based component is not a PiN diode, since the 'I' intrinsic layer (without any doping) is missing. Due to the high current gain of npn transistor 852, the bias circuit does not require a high current driving capability (and does not need low output impedance). The voltage at 838 is constant. In order to provide more bias current from bias circuit 830, 852 (as npn transistor 852 is thus both part or the bias circuit for 854 as well as being a part of the push-pull configuration), the Vbe of the emitter follower 831 will slightly increase, which results in a slight voltage decrease at node 850. Node 850 also couples the receiver port 810 to the λ/4 transmission line (TL) 822, as well as connects the emitter follower 831 with the negative junction of the second diode-based device (such as second PiN diode 854).

Figure 9:
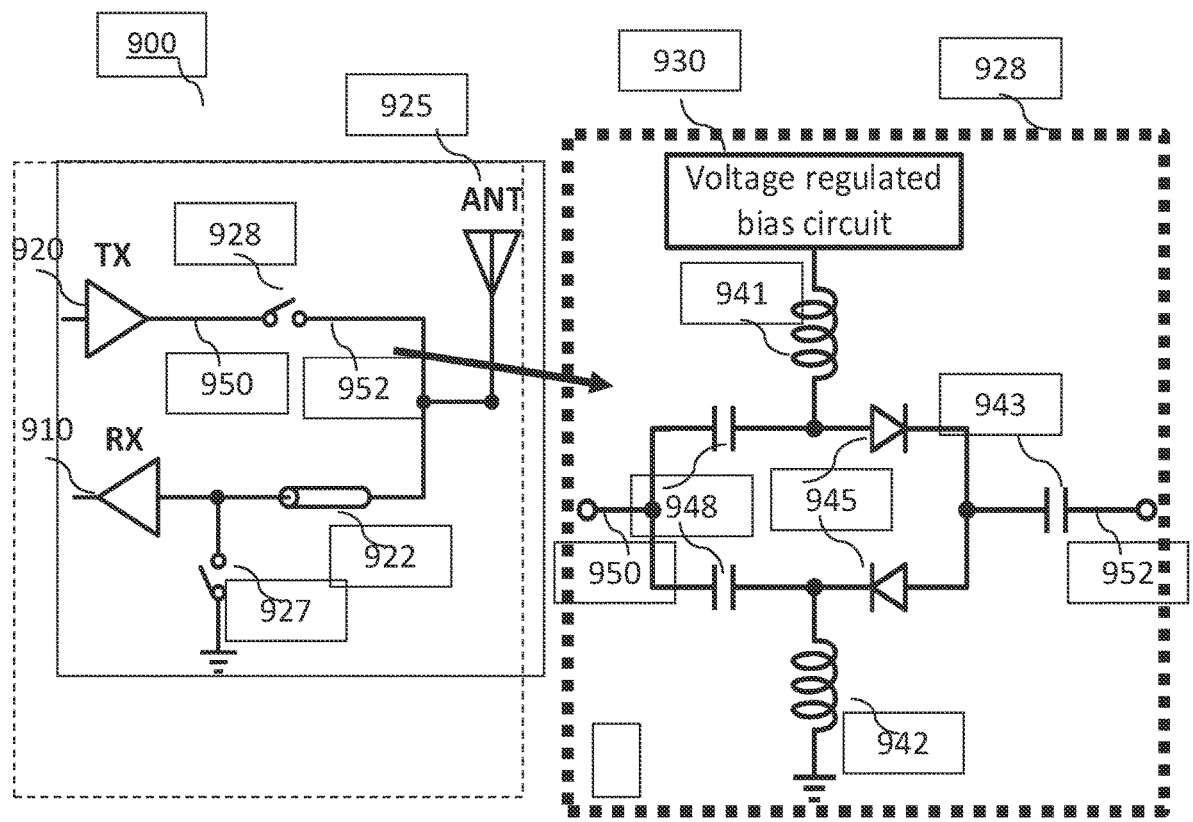
FIG. 9 illustrates a further alternative topology to apply a similar push-pull PiN diode configuration as a series switch, according to some example embodiments of the invention.

FIG. 9 illustrates a further alternative topology to apply a similar push-pull diode-based configuration as a series switch, according to some example embodiments of the invention. In this example, the communication unit 900 is illustrated as a transmitter section 920 coupled to an antenna 925 via a series switch 928. The antenna is also coupled to a receiver section 910 via a λ/4 transmission line (TL) 922 and a shunt switch 927. Here, the series switch 928 is configured to utilize a push-pull diode-based configuration.

The series switch 928 is controlled by a voltage regulated bias circuit 930, connected via an inductance 941. The series switch 928 comprises parallel paths that use a push-pull PiN diode 945 circuit coupled to a respective capacitor 948. A further inductance 942 couples the switch, on one of the parallel paths, to ground 902. The voltage regulated bias circuit 930 thus controls whether the series switch 928 is configured as 'ON' (closed) or 'OFF' (open).

In a transmit mode, the voltage regulated bias circuit 930 generates a positive bias voltage (similar to the voltage at node 356 in FIG. 3) to turn 'ON' the push-pull PiN diode 945 circuit. The capacitors 948 and 943 serves as the ac coupling. In this manner, the RF signal can pass from node 950 to 952 and transmit out through antenna 925.

In a receive mode, the voltage regulated bias circuit 930 generates a 0V (or negative voltage) to turn 'OFF' the PiN diode 945 circuit. Then the node 952 is isolated by the OFF-state PiN diodes and serves as a RF open-circuit. Thus, the RF signal from antenna 925 will not leak to the transmit path 952 and will be received by the receive circuit.

Alternatively, in some examples, a dc switching circuit can be added at node 954 to avoid generating negative dc bias voltage (to decrease analog circuit complexity), which then connects the node 954 to ground in a transmit mode, and connects node 954 to Vcc (to reverse-bias the PiN diodes) in receive mode.

It is envisaged that this further alternative topology 900 may be employed as a series switch with high linearity and low dc power dissipation, which may be useful for some single-pole, double-throw (SPDT) switch applications.

Figure 10:
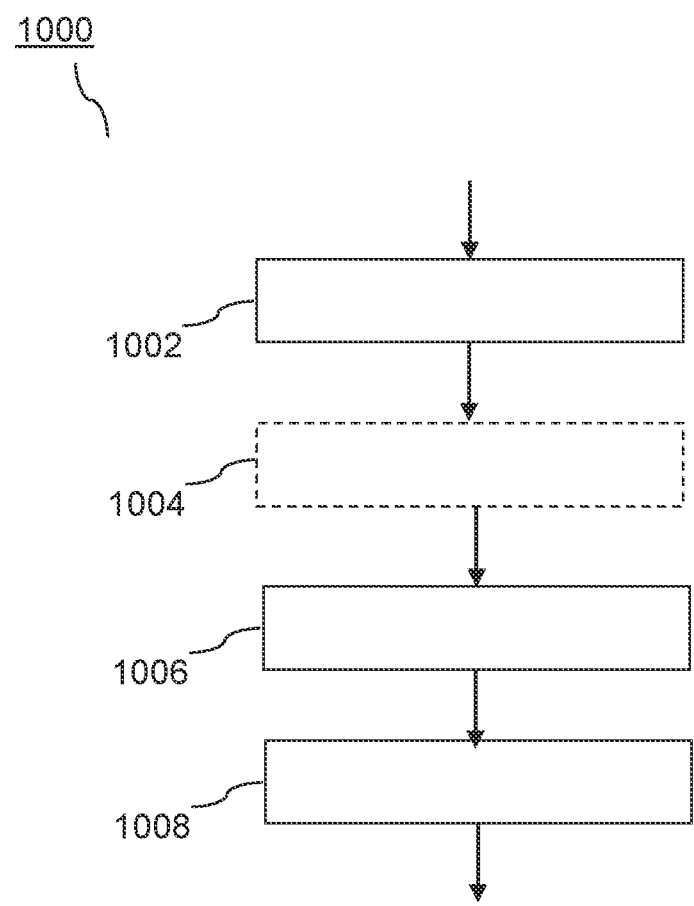
FIG. 10 illustrates a brief flowchart highlighting a method of RF switching using a push-pull arrangement of a combination of at least one first PiN diode device and a second diode-based device, according to some example embodiments of the invention.

FIG. 10 illustrates a brief flowchart 1000 highlighting a method of RF switching using a push-pull arrangement of a combination of at least one first PiN diode device and a second diode-based device, according to some example embodiments of the invention. The flowchart 1000 includes connecting, at 1002, at least one first PiN diode device to a second diode-based device to operate as a push-pull diode-based RF switch circuit. For a quarter wavelength (λ/4) transmission line (TL) switch operation, the flowchart 1000 further includes an optional step of connecting, at 1004, an impedance inversion circuit to the at least one first PiN diode device that provides a transformed impedance between a first side of the impedance inversion circuit and a second side or the impedance inversion circuit. In some examples, impedance inversion step 1004 of flowchart 1000 does not apply to FIG. 9, as the transmit switch 928 does not have the impedance inversion. The flowchart 1000 further includes applying, at 1006, a bias current to at least one of the at least one first PiN diode device and the second diode-based device, wherein the applied bias current configures the at least one first PiN diode device and the second diode-based device to sink an alternating current or source an alternating current. At 1008, the bias current is changed to switch the RF signal. Switching the RF signals occurs as follows: both diodes are forward biased in the "on" position, allowing current to flow. Here, positive RF current goes through the one diode, negative current goes through the other diode. When the diodes are reversed biased, neither allows any RF current to flow through them, thus turning the switch "of".

Figure 11:
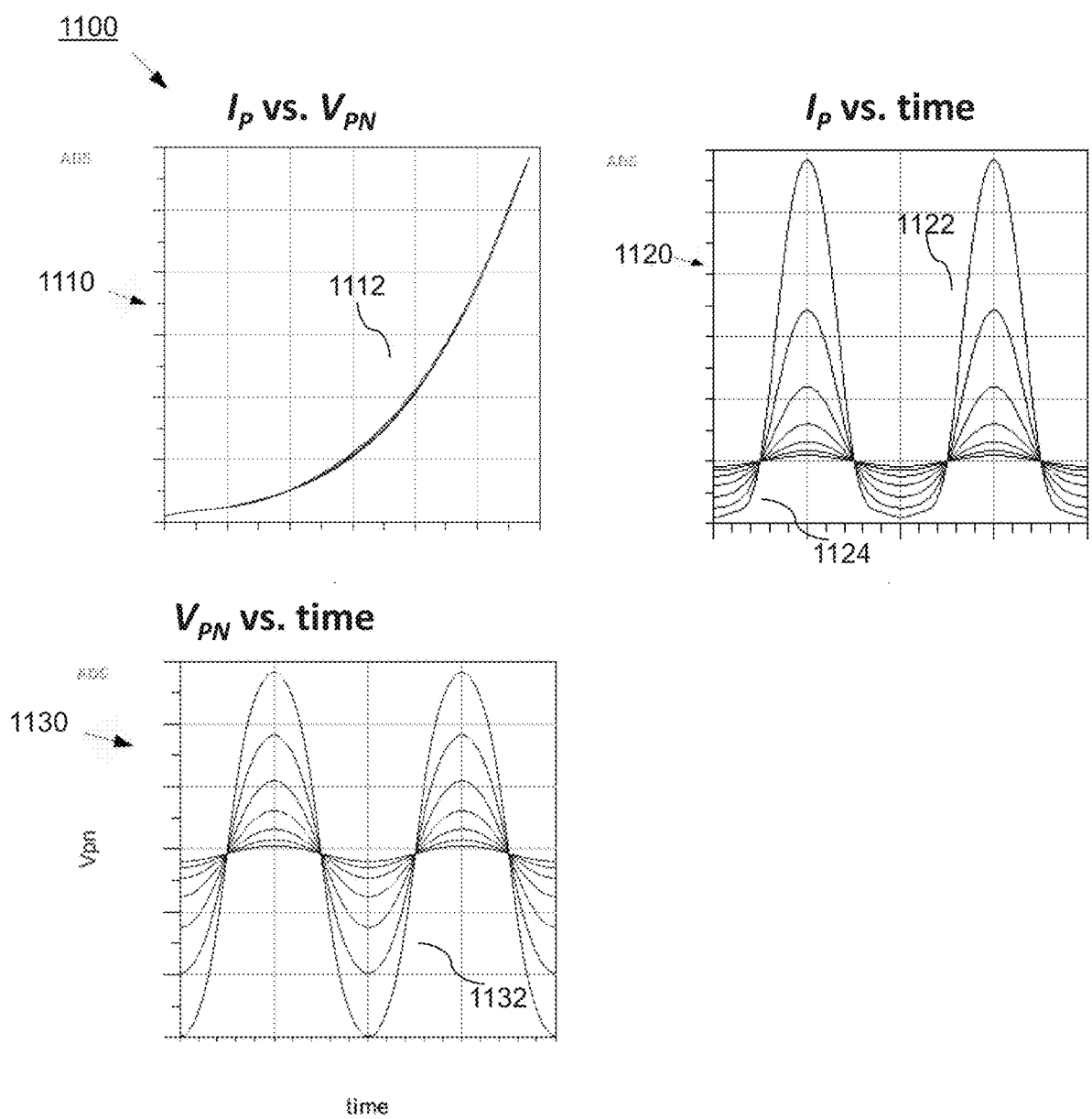
FIG. 11 illustrates a series of graphs of a λ/4 RF switch circuit of FIG. 2, showing a self-bias (rectification) effect or PiN diodes, according to some example embodiments or the invention.

For completeness, and referring now to FIG. 11, FIG. 11 illustrates a series of graphs of a λ/4 RF switch circuit of FIGS. 2-9, showing a self-bias (rectification) effect of PiN diodes, according to some example embodiments of the invention.

The famous Shockley diode equation (or the diode law) is known to be:

$$I_P = I_S \left( e^{\frac{V_{PN}}{nV_T}} - 1 \right) = f(V_{PN}) \quad [2]$$

where, $I_P$ is the diode current, $I_S$ is the reverse bias saturation current (or scale current), $V_{PN}$ is the voltage across the diode, $V_T$ is the thermal voltage kT/q (Boltzmann constant times temperature divided by electron charge), and n is the ideality factor, also known as the quality factor or sometimes emission coefficient Referring now to FIG. 11, FIG. 11 illustrates exemplary simulations 1100 of a number of graphs showing the self-bias (rectification) effect of PiN diodes, according to example embodiments of the invention. A first graph 1110 illustrates an exponential relationship of diode current (Ip) vs. the voltage across the diode 1112. A second graph 1120 illustrates diode current (Ip) vs. time 1122. A third graph 1130 illustrates the voltage across the diode vs. time 1132. Due to this Exponential relationship between the current and voltage, when there is sine voltage waveform across the diode, the current is rectified 1124. Hence, the dc component of $I_P$ (bias current of $I_P$) is adaptively increased with the ac current amplitude increasing: which is referred to as the self-biasing effect.

For a further mathematical explanation, let us assume:

$$V_{PN} = V_{BIAS} + A^* \sin(wt) \quad [3]$$

where $V_{BIAS}$ is the bias voltage of PiN diode, and

A is the amplitude of the voltage sine waveform.

Then a Taylor expansion can be constructed for the first equation:

$$I_P = f(V_{PN}) = f(V_{BIAS}) + \frac{f'(V_{BIAS})}{1!}(V_{PN} - V_{BIAS}) + \quad [4]$$
$$\frac{f''(V_{BIAS})}{2!}(V_{PN} - V_{BIAS})^2 + \frac{f'''(V_{BIAS})}{3!}(V_{PN} - V_{BIAS})^3 + \ldots$$
$$= I_{BIAS} + I_S e^{\frac{V_{BIAS}}{nV_T}} \times \left[ \left( \frac{A\sin\omega t}{nV_T} \right)^1 + \left( \frac{A\sin\omega t}{nV_T} \right)^2 + \left( \frac{A\sin\omega t}{nV_T} \right)^3 + \ldots \right]$$

While:

$$I_{BIAS} = I_S \left( e^{\frac{V_{BIAS}}{nV_T}} - 1 \right),$$

which refers to the quiescent bias current of PiN diode (when A=0).

Note that (sin wt)$^n$ can generate the positive dc component. For example:

$$(\sin\omega t)^2 = \frac{1}{2} - \frac{\cos\omega t}{2}. \quad [5]$$

More generally, when n is an even number, (sin wt)$^n$ will generate dc component:

$$\left(\frac{1}{2}\right)^n \binom{n}{n/2} = \left(\frac{1}{2}\right)^n \frac{n!}{(n/2)!(n/2)!} \quad [6]$$

Hence, the dc component of $I_P$ increases with $V_{PN}$ amplitude increasing. This is a non-linear effect, as shown in the graph 1120 of $I_P$ vs time.

Although the examples above have been described with reference to a communication unit targeted for fifth generation use for millimeter-wave 5G RF front-end IC products, it is envisaged that the concepts herein described may be used in much wider applications, such as millimeter radar and/or sixth generation (6G) RF front-end IC products. Indeed, it is envisaged that the higher the frequency of application, the more attractive it is for the designer to employ PiN diodes in the described push-pull diode-based configurations and topologies.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above. Clearly, the various components within the wireless communication unit 200 can be realized in discrete or integrated component form, with an ultimate structure therefore being an application-specific or design selection.

In some examples, the circuits may be implemented using discrete components and circuits, whereas in other examples the circuit may be formed in integrated form in an integrated circuit for example using any impedance inverting circuit, such as a quarter wave (λ/4) transmission lines. Because the illustrated embodiments of the present invention may, for the most part, be implemented using electronic components and circuits known to those skilled in the art, details have not been explained in any greater extent than that considered necessary as illustrated below, for the understanding and appreciation of the underlying concepts of the present invention and in order not to obfuscate or distract from the teachings of the present invention.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals. Those skilled in the art will recognize that the architectures depicted herein are merely exemplary, and that in fact many other architectures can be implemented which achieve the same functionality.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the circuit and/or component examples may be implemented as any number or separate integrated circuits or separate devices interconnected with each other in a suitable manner. However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A radio frequency, RF, switch circuit comprising:
   at least one first PiN diode device configured to sink or source a first alternating current;
   an impedance inversion circuit, connected to the at least one first PiN diode device and arranged to provide a transformed impedance between a first side of the impedance inversion circuit and a second side of the impedance inversion circuit;
   a second diode-based device configured to source or sink a second alternating current; and
   a bias circuit connected to at least one of the at least one first PiN diode device and the second diode-based device, wherein the at least one first PiN diode device cooperates with the second diode-based device as a push-pull current circuit;
   wherein the bias circuit comprises a voltage regulator having a closed loop operational amplifier having an input that receives a reference voltage and an output that provides a dc bias current to the at least one first PiN diode device, such that a bias voltage applied to the at least one first PiN diode device remains constant when a dc component of a bias current of the at least one first PiN diode device increases.

2. The RF switch circuit of claim 1 wherein the second diode-based device is a second PiN diode.

3. The RF switch circuit of claim 1, wherein the bias circuit further comprises an emitter follower as a buffer amplifier located between the operational amplifier and a positive junction of the at least one first PiN diode device, and configured to provide a stable bias voltage to a positive junction of the at least one first PiN diode device.

4. The RF switch circuit of claim 1, wherein the bias circuit comprises a current mirror that receives a current source and wherein an output provides a dc bias current to the at least one first PiN diode device, such that a bias voltage applied to the at least one first PiN diode device remains constant when a dc component of a bias current of the at least one first PiN diode device increases.

5. The RF switch circuit of claim 1, wherein the bias circuit comprises a transimpedance amplifier circuit comprising a transistor configured to provide a bias current to a negative junction of the second diode-based device such that when the bias current of the second diode-based device increases, the transistor in the transimpedance amplifier circuit sinks current to maintain a constant voltage at the negative junction of the second diode-based device.

6. The RF switch circuit of claim 1, wherein the at least one first PiN diode device is a npn transistor switch coupled to the bias circuit and where a P-N junction between a base junction and an emitter junction of the npn transistor switch is used as a diode with the second diode-based device and configured as a push-pull current circuit that supports both current sourcing and current sinking.

7. A communication unit comprising the RF switch according to claim 1.

8. The RF switch circuit of claim 1 wherein the impedance inversion circuit is located between a receive port and a transmit port and the impedance inversion circuit comprises one of: (i) a quarter-wave transmission line, (ii) a circuit comprised of a first lumped ac decoupling capacitor, C, with a series inductor, L, with a second ac decoupling capacitor C.

9. The RF switch circuit of claim 1 wherein the RF switch circuit is coupled to a pre-power amplifier circuit in a transmit path and forward biasing the at least one first PiN diode device and the second diode-based device reuses current flowing through the pre-power amplifier circuit.

10. The RF switch circuit of claim 1 wherein the at least one first PiN diode device and the second diode-based device are forward biased, turned 'ON', when the RF switch circuit is configured to operate in a first receive mode of operation and wherein the at least one first PiN diode device and the second diode-based device are reverse biased and turned off in a second transmit mode of operation.

11. The RF switch circuit of claim 10 wherein the impedance inversion circuit is located between a receive port and a transmit port and the impedance inversion circuit comprises one of: (i) a quarter-wave transmission line, (ii) a circuit comprised of a first lumped ac decoupling capacitor, C, with a series inductor, L, with a second ac decoupling capacitor C.

12. The RF switch circuit of claim 10 wherein the RF switch circuit is coupled to a pre-power amplifier circuit in a transmit path and forward biasing the at least one first PiN diode device and the second diode-based device reuses current flowing through the pre-power amplifier circuit.

13. The RF switch circuit of claim 10 wherein the second diode-based device is a second PiN diode.

14. The RF switch circuit of claim 10 wherein the RF switch circuit comprises a shunt switch activated to operate the RF switch circuit in the first receive mode of operation and comprises a series switch activated to operate the RF switch circuit in the second transmit mode of operation.

15. The RF switch circuit of claim 10, wherein the at least one first PiN diode device is a npn transistor switch coupled to the bias circuit and where a P-N junction between a base junction and an emitter junction of the npn transistor switch is used as a diode with the second diode-based device and configured as a push-pull current circuit that supports both current sourcing and current sinking.

16. A radio frequency, RF, switch circuit comprising:
at least one first PiN diode device configured to sink or source a first alternating current;
an impedance inversion circuit, connected to the at least one first PiN diode device and arranged to provide a transformed impedance between a first side of the impedance inversion circuit and a second side of the impedance inversion circuit;
a second diode-based device configured to source or sink a second alternating current; and
a bias circuit connected to at least one of the at least one first PiN diode device and the second diode-based device, wherein the at least one first PiN diode device cooperates with the second diode-based device as a push-pull current circuit;
wherein the at least one first PiN diode device and the second diode-based device are forward biased, turned 'ON', when the RF switch circuit is configured to operate in a first receive mode of operation and wherein the at least one first PiN diode device and the second diode-based device are reverse biased and turned off in a second transmit mode of operation;
wherein the bias circuit further comprises an emitter follower as a buffer amplifier located between the operational amplifier and a positive junction of the at least one first PiN diode device, and configured to provide a stable bias voltage to a positive junction of the at least one first PiN diode device.

17. A radio frequency, RF, switch circuit comprising:
at least one first PiN diode device configured to sink or source a first alternating current;
an impedance inversion circuit, connected to the at least one first PiN diode device and arranged to provide a transformed impedance between a first side of the impedance inversion circuit and a second side of the impedance inversion circuit;
a second diode-based device configured to source or sink a second alternating current; and
a bias circuit connected to at least one of the at least one first PiN diode device and the second diode-based device, wherein the at least one first PiN diode device cooperates with the second diode-based device as a push-pull current circuit;
wherein the at least one first PiN diode device and the second diode-based device are forward biased, turned 'ON', when the RF switch circuit is configured to operate in a first receive mode of operation and wherein the at least one first PiN diode device and the second diode-based device are reverse biased and turned off in a second transmit mode of operation;
wherein the bias circuit comprises a current mirror that receives a current source and wherein an output provides a dc bias current to the at least one first PiN diode device, such that a bias voltage applied to the at least one first PiN diode device remains constant when a dc component of a bias current of the at least one first PiN diode device increases.

18. A radio frequency, RF, switch circuit comprising:
at least one first PiN diode device configured to sink or source a first alternating current;
an impedance inversion circuit, connected to the at least one first PiN diode device and arranged to provide a transformed impedance between a first side of the impedance inversion circuit and a second side of the impedance inversion circuit;
a second diode-based device configured to source or sink a second alternating current; and
a bias circuit connected to at least one of the at least one first PiN diode device and the second diode-based device, wherein the at least one first PiN diode device cooperates with the second diode-based device as a push-pull current circuit;
wherein the at least one first PiN diode device and the second diode-based device are forward biased, turned 'ON', when the RF switch circuit is configured to operate in a first receive mode of operation and wherein the at least one first PiN diode device and the second diode-based device are reverse biased and turned off in a second transmit mode of operation;
wherein the bias circuit comprises a transimpedance amplifier circuit comprising a transistor configured to provide a bias current to a negative junction of the second diode-based device such that when the bias current of the second diode-based device increases, the transistor in the transimpedance amplifier circuit sinks current to maintain a constant voltage (635) at the negative junction of the second diode-based device.

* * * * *